United States Patent
Lucidarme et al.

(10) Patent No.: US 11,125,822 B2
(45) Date of Patent: Sep. 21, 2021

(54) METHOD FOR EVALUATING AN ELECTRIC BATTERY STATE OF HEALTH

(71) Applicant: ELECTRICITE DE FRANCE, Paris (FR)

(72) Inventors: Thierry Lucidarme, Chevreuse (FR); Jan Jasper van den Berg, Lausanne (CH); Julian Charles Nolan, Pully (CH); Timothy Giles Beard, Cambridge (GB)

(73) Assignee: ELECTRICITE DE FRANCE, Paris (FR)

(*) Notice: Subject to any disclaimer, the term of this patent is extended or adjusted under 35 U.S.C. 154(b) by 156 days.

(21) Appl. No.: 16/458,643

(22) Filed: Jul. 1, 2019

(65) Prior Publication Data
US 2020/0011931 A1 Jan. 9, 2020

(30) Foreign Application Priority Data
Jul. 3, 2018 (EP) .................................... 18305866

(51) Int. Cl.
*G01R 31/367* (2019.01)
*G01R 31/392* (2019.01)

(52) U.S. Cl.
CPC ......... *G01R 31/367* (2019.01); *G01R 31/392* (2019.01)

(58) Field of Classification Search
CPC ............................. G01R 31/367; G01R 31/392
See application file for complete search history.

(56) References Cited

U.S. PATENT DOCUMENTS

| 2008/0235172 | A1* | 9/2008 | Rosenstein | G06N 7/005 706/46 |
| 2009/0027056 | A1* | 1/2009 | Huang | G01R 31/389 324/439 |
| 2010/0198536 | A1* | 8/2010 | Hess | G01R 31/3842 702/63 |
| 2016/0003917 | A1* | 1/2016 | You | G01R 31/367 702/63 |
| 2016/0178706 | A1* | 6/2016 | Liu | G01R 31/392 702/63 |
| 2016/0187428 | A1* | 6/2016 | Basu | G01R 31/367 702/63 |

(Continued)

FOREIGN PATENT DOCUMENTS

CN 103278777 B 8/2015

OTHER PUBLICATIONS

He et al., "Prognostics of lithium-ion batteries based on Dempster-Shafer theory and the Bayesian Monte Carlo method," Journal of Power Sources, Elsevier SA, CH, Aug. 6, 2011, vol. 196 (23), pp. 10314-10321.

(Continued)

*Primary Examiner* — Raymond L Nimox
(74) *Attorney, Agent, or Firm* — Faegre Drinker Biddle & Reath LLP

(57) ABSTRACT

A method for evaluating a state of health (SOH) of an electric battery of an electric vehicle, said method comprising a step of: performing on said electric battery, under given conditions, a test, called proxy test, said proxy test including a partial charge and/or discharge action of the battery, comparing the results of the proxy test with data stored in a dataset, and estimating the SOH in function of the comparison result.

10 Claims, 2 Drawing Sheets

(56) References Cited

U.S. PATENT DOCUMENTS

2016/0245876 A1* 8/2016 Vinassa .................... H02J 7/00
2018/0031642 A1* 2/2018 Sung .................... G01R 31/392
2020/0164763 A1* 5/2020 Holme .................... B60L 58/10

OTHER PUBLICATIONS

Ng et al., "A naive Bayes model for robust remaining useful life prediction of lithium-ion battery," Applied Energy, vol. 118, Jan. 8, 2014, pp. 114-123.

Saha et al., "An Integrated Approach to Battery Health Monitoring Using Bayesian Regression and State Estimation," Autotestcon, 2007 IEEE, Sep. 1, 2007, pp. 646-653.

European Search Report issued in related application EP 18305866. 8, dated Feb. 7, 2019, 16 pages.

* cited by examiner

METHOD FOR EVALUATING AN ELECTRIC BATTERY STATE OF HEALTH

CROSS-REFERENCE TO RELATED APPLICATION

This application claims priority benefit under 35 U.S.C. § 119(d) from European Patent Application No. 18305866.8, filed Jul. 3, 2018, the disclosure of which is incorporated by reference herein in its entirety.

FIELD

The disclosure relates to a method for evaluating a state of health (SOH) of an electric battery of an electric vehicle.

BACKGROUND

The degradation of the battery of an electric vehicle is caused over time by various conditions and usage parameters that the battery is operated under, such as high and low temperatures, applied voltages, currents and depth-of-discharge.

Many electric vehicle owners would like to be informed about how to optimally maintain vehicle range, battery life (and resale value of their battery).

Therefore, there is a large interest to keep track of the battery degradation and how it is related to electric vehicle operating conditions.

An important measure of the condition of the electric Vehicle battery is its State-Of-Health (SOH), which is an indicator for the capacity of the battery—or alternatively its degradation—i.e. a percentage indicating to what extent a battery's current capabilities match to its initial factory specifications.

The SOH is an important indicator as it directly relates to the maximum range of the electric vehicle and the time to replace the battery.

The SOH is usually determined by performing a full discharge-charge cycle of the battery, which can be detrimental to the battery.

Also, the conditions in which the SOH test should be done are quite strict to yield reliable and reproducible results. However, these conditions may be difficult to achieve for the car's owner.

However, various problems exist related to the performing of measurements to determine the battery's SOH under real world conditions.

SUMMARY

Accordingly, it is an object of the present disclosure to resolve the above mentioned problems in providing an easier and less-invasive method for evaluating a state of health (SOH) of an electric battery of an electric vehicle, said method comprising a step of: performing on said electric battery, under given conditions, a test, called proxy test, said proxy test comprising a partial charge and/or discharge action of the battery, comparing the results of the proxy test with data stored in a dataset, and estimating the SOH in function of the comparison result.

According to an embodiment, the step of performing the proxy test comprises a step of comparing proxy tests that are available in a dataset, associating a score to each test, ranking by said tests, and executing the highest-ranking test, called proxy test, if the associated score is higher than or equals to a predetermined threshold.

According to an embodiment, the score depends on the given conditions of the battery.

According to an embodiment, if the associated score is smaller than the predetermined threshold, no proxy test is performed.

According to an embodiment, the step of estimating the SOH comprises a Bayesian ponderation.

According to an embodiment, the method comprises a step of performing a full SOH test, comprising a full charge and/or discharge action of the battery, and storing the result in the dataset.

According to an embodiment, performing a full SOH test is done if a SOH testing cost is smaller than a value associated to the proxy test calculation.

According to an embodiment, performing a full SOH and storing the result in the dataset is preliminary to any proxy test.

According to an embodiment, the method comprises a step of storing the results of the proxy tests in the dataset.

The disclosure also relates to a computer program comprising a sequence of instructions implementing the steps of the method as described when executed by a processor.

The disclosure also relates to a non-transitory storage medium readable by computer comprising a computer program as described.

The disclosure also relates to a system, comprising a sensor for determining the battery conditions and a unit comprising said non-transitory medium.

BRIEF DESCRIPTION OF THE DRAWINGS

The disclosure is now described by way of example with reference to the accompanying drawings in which.

DETAILED DESCRIPTION

State of Battery

The disclosure relates to a method for evaluating a state of health (SOH) of an electric battery of an electric vehicle (EV), said method being referenced to as 1 in the figures.

As already explained, the SOH is an indicator for the capacity of the battery or alternatively its degradation, which is a percentage indicating to what extent a battery's current capabilities match to its initial factory specifications.

In other words, a SOH corresponds to the remaining potential of the electric battery.

System

Figure 1:
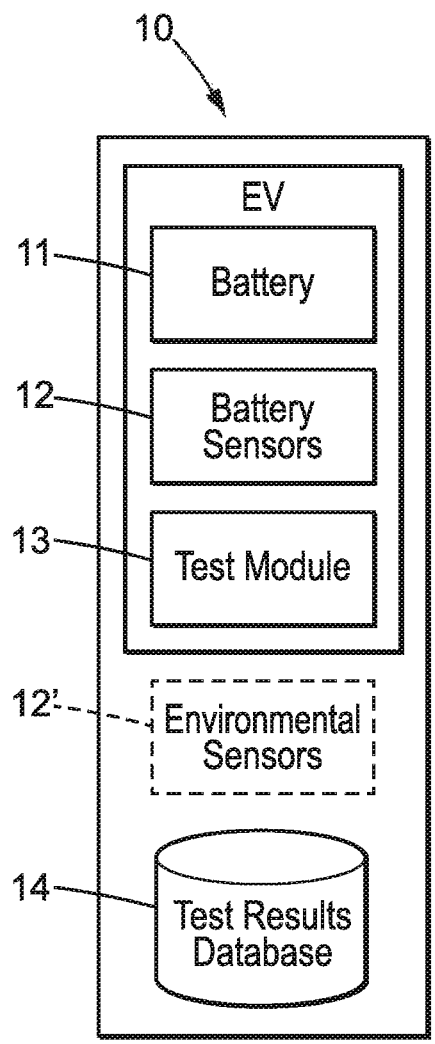
FIG. 1 illustrates a system configured to perform a method for evaluating a battery state of an electric vehicle according to an embodiment.

As can be seen from FIG. 1, a system 10 comprises an electric battery 11.

The battery 11 is a rechargeable battery used to power the propulsion of an electric vehicle or to provide power to other applications.

The system 10 also comprises one or more sensors 12 to collect a dataset of physical parameters, called the status of the battery, used to characterise the state of the battery.

The sensors include for instance:
- current and/or voltage sensors, optionally comprising additional electronic circuits, to measure the battery's internal impedance or output power, and/or
- temperature sensors configured to measure a local temperature of the battery, and/or
- cycle counter keeping track of the number of charge-discharge cycles completed by the battery (or an approximation of these, considering the battery will often not be fully charged and/or discharged).

Optionally, the system 10 can comprise environmental sensors 12' able to collect a dataset of various parameters to characterise the conditions during the testing of the battery, in addition to the battery sensor data.

The environmental sensors can be:
- outside temperature or humidity sensors, and/or
- in-vehicle sensors measuring speed/movement of the vehicle, usage of various in-vehicle appliances, and/or
- positioning systems such as GPS gathering information about the location of the vehicle.

As can be seen from FIG. 1, the system 10 also comprises a test module 13 configured to execute tests (so called proxy and full tests) by operating the battery to undergo a desired charging/discharging cycle and collecting various data (thanks to the sensors) and metadata (e.g. timestamps for instance).

A full test is a test to be performed to the battery to determine its SOH (i.e. giving as output a number, percentage or status description representing the SOH of the battery), typically comprising a controlled charge and/or discharge action under a set of pre-defined environmental conditions. For example: a measurement of the duration of a full charge-discharge cycle under a fixed voltage and environmental temperature, while monitoring various conditions such as internal impedance, current and cell temperature.

A proxy test comprises partial charge and/or discharge action of the battery, whereas other tests, called full tests, include a full charge and/or discharge action of the battery.

The proxy tests are less invasive than the full tests.

Also, the conditions in which the full tests are done are quite strict to yield reliable and reproducible results whereas the proxy tests are easier to achieve, the owner of the car deciding the conditions of the proxy tests.

The proxy tests may comprise different kinds of tests.

For example, a proxy test consists in a simple measurement of a conductance of the battery, rate of voltage discharge of the battery, heat measurement of the battery . . . .

For example: a discharge from 60% to 50% state-of-charge under a fixed discharge rate, while monitoring various conditions such as internal impedance, current and cell temperature.

In other words, a proxy test is a test to be performed on the battery to estimate its SOH (i.e. giving as output a number, percentage or status description representing the most likely SOH), typically less invasive. A proxy test may also consist of creating a fixed charging/discharging rate or sequence in line with a usage pattern. Examples may be the usage of the vehicle (e.g. fixed speed over a fixed distance), the charging of the vehicle's battery (e.g. fixed charging parameters over a fixed time) or the usage of in-vehicle appliances to create a desired discharging rate.

As already noted, the results of the tests are collected in the datasets of the system 10, the measurements being realized by the sensors 12 as well as the environmental sensors.

The test module may be able to perform the tests automatically or in cooperation with the user, for instance during driving.

Please note that in some embodiments the full tests and the proxy tests may be performed by two separate tests.

The system 10 further comprises a test results database 14, which is a centrally accessible database storing data gathered by the test module.

The test results database comprises two datasets:
- the full test dataset comprising all the data and metadata as gathered when executing the full test, and
- the proxy test dataset comprising all data and metadata as gathered when executing the proxy test.

The test results data which may be included in the full test dataset and/or the proxy test dataset are for example battery sensors data and environmental sensor data, information about the user and/or vehicle, like user ID, vehicle make, model, fabrication year, battery specifications, and other variables which may influence the battery's SOH over time, like information related to driving behaviour, weather, climate, regular travel routes.

Preferably, the test results data also comprises results of proxy tests and full tests of other vehicles, for instance vehicles of the same car model.

Method

The system 10 also comprises units for performing the method 1 and its subprocesses, as are going to be described in relation with FIGS. 2 to 5.

Figure 2:
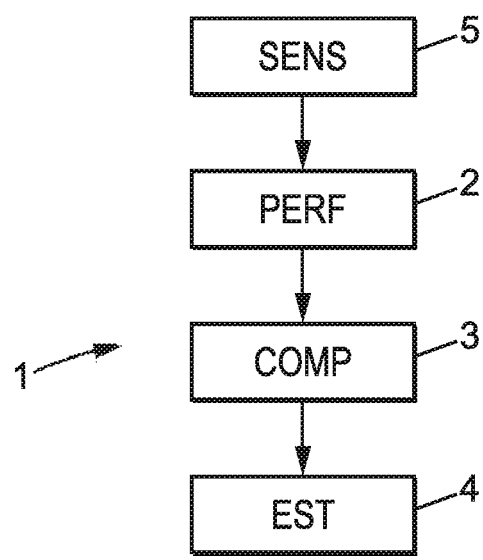
FIG. 2 illustrates a chronogram of said method.

As can be seen from FIG. 2, the method 1 comprises:
- a step 2 of performing PERF on said electric battery, under given conditions, a test, called proxy test, said proxy test comprising a partial charge and/or discharge action of the battery,
- a step 3 of comparing COMP the results of the proxy test with data stored in the test results database, and
- a step 4 of estimating the SOH in function of the comparison result.

In other words, the method 1 takes as inputs a proxy test as well as historic test result data previously gathered in the test results database and gives as output an estimate of the most likely SOH of the Battery.

The method 1 allows to calculate the SOH Estimate, without having to perform a full test.

The method 1 comprises a step 5 (SENS) preliminary to step 2, in which the sensors determine the status and conditions of the battery, as already mentioned.

Preferably, the step 4 of estimating the SOH function comprises a step 6 of performing a Bayesian ponderation.

The steps 3 and 4 are now described with an example.

Bayesian Ponderation

The following table gives an example of the results of a proxy test.

Each test M1 (measurement of a conductance of the battery), M2 (rate of voltage discharge of the battery), M3 (heat measurement of the battery), can either succeed or fail, such that each test is associated to two Boolean results, noted respectively T1 (test passed), $\overline{T1}$ (test failed), T2 (test passed), $\overline{T2}$ (test failed), and T3 (test passed) and $\overline{T3}$ (test failed):

| Battery state (SOH) | M1 T1 | M1 $\overline{T1}$ | M2 T2 | M2 $\overline{T2}$ | M3 T3 | M3 $\overline{T3}$ | Total |
|---|---|---|---|---|---|---|---|
| Green | 40 | 10 | 35 | 15 | 40 | 10 | 50 |
| Orange | 20 | 10 | 15 | 15 | 25 | 5 | 30 |
| Red | 15 | 5 | 15 | 5 | 10 | 10 | 20 |
| Total | 75 | 25 | 65 | 35 | 75 | 25 | 100 |

The last full test had for results 50 green SOH, 30 orange ones and 20 red ones.

A proxy test is performed, which results in T1, T2 and $\overline{T3}$.

The method 1 estimates the SOH, i.e., the estimated SOH, with the following equations based on the Bayes theorem:

$$P(\text{green}/T1, T2, \overline{T3}) = \frac{P(T1/\text{green})P(T2/\text{green})P(\overline{T3}/\text{green})}{Pn}P(\text{green}),$$

$$P(\text{orange}/T1, T2, \overline{T3}) = \frac{P(T1/\text{orange})P(T2/\text{orange})P(\overline{T3}/\text{orange})}{Pn}P(\text{orange}),$$

$$P(\text{red}/T1, T2, \overline{T3}) = \frac{P(T1/\text{red})P(T2/\text{red})P(\overline{T3}/\text{red})}{Pn}P(\text{red}),$$

Where Pn is a normalization coefficient:

$$Pn = P(\text{green})P(\text{orange})P(\text{red}).$$

Please note that P(green/T1,T2,$\overline{T3}$) is the probability that the SOH is green knowing the proxy test T1, T2 and $\overline{T3}$, P(orange/T1, T2, $\overline{T3}$) is the probability that the SOH is orange knowing the proxy test T1, T2 and $\overline{T3}$, and P(red/T1,T2,$\overline{T3}$) is the probability that the SOH is red knowing the proxy test T1, T2 and $\overline{T3}$.

Please also note that P(Ti/green) is the probability of Ti knowing that the SOH is green, while P(Ti/orange) is the probability of Ti knowing that the SOH is orange and P(Ti/red) is the probability of Ti knowing that the SOH is red.

Furthermore, please note that P(green) is the probability that the SOH is green, P(orange) is the probability that the SOH is orange, and P(red) is the probability that the SOH is red.

It can be deduced from the table that P(green)=0.5, P(orange)=0.3, and P(red)=0.2. And Pn=0.03.

Additionally, P(T1/green)=0.4, P(T2/green)=0.35, and P($\overline{T3}$/green)=0.1.

Moreover, P(T1/orange)=0.2,
P(T2/orange)=0.15 and
P($\overline{T3}$/orange)=0.05.

Also, P(T1/red)=0.15, P(T2/red)=0.15 and P($\overline{T3}$/red)=0.1.
Therefore, $$P(\text{green}/T1,T2,\overline{T3})=0.23,$$

$$P(\text{orange}/T1,T2,\overline{T3})=0.015,$$

$$P(\text{red}/T1,T2,\overline{T3})=0.015.$$

Since green SOH has the strongest probability, the estimated SOH is green, i.e., the remaining potential is estimated to be above 70%.

Preliminary Subprocess

Figure 3:
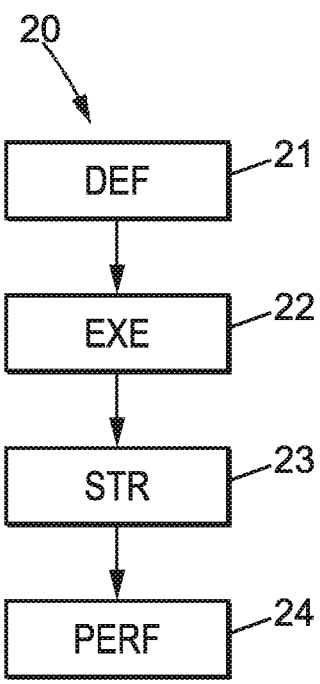
FIGS. 3 to 5 illustrate subprocesses of the method of FIG. 2.
Figure 4:
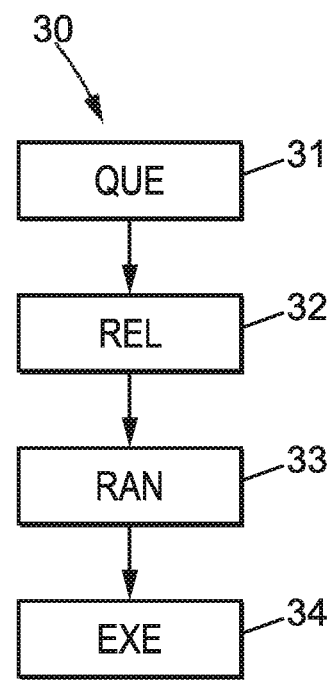

As seen in FIG. 3, the method 1 also comprises a first preliminary subprocess 20, called proxy test training data gathering, to gather a dataset which can be used to correlate the proxy test dataset to the battery's SOH.

The subprocess 20 is achieved by performing both a proxy test and a full test to gather the test results data and add this to the test results database.

More precisely, a proxy test is defined (step 21, DEF).

The definition of the proxy test comprises all instructions for the test module to correctly gather the proxy test dataset, for example:
test parameters (like charge/discharge sequence and rate, duration of the test),
required test conditions prior to or during the test (like temperature, operational parameters of the vehicle), and
required sensor data to be gathered during the test (e.g. battery sensor data, environmental sensor data).

The proxy test may be either pre-defined by the electric vehicle or battery supplier, or user defined, for instance based on user preferences, historic usage patterns or copied from other users or available proxy test datasets as can be accessed from the test results database.

Then, the test module executes the proxy test (step 22, EXE) according to the instructions defined under step 21 and thus generates the proxy test dataset.

The test module may perform the proxy test automatically, or the user may be involved in executing the test, e.g. by manually starting or scheduling the proxy test, by performing actions as prompted by the system such as maintaining a certain driving style to create a desired discharge rate.

The gathered proxy test dataset is stored in the test results database (step 23, STR).

A full test is also performed (step 24, PERF) and stored in the test results database, thus providing a complete dataset, called the test results data, which, when added to the test results database, may be used later to improve the SOH estimate as determined in steps 1 to 5.

Alternative Subprocess

As seen in FIG. 3, the method 1 comprises another subprocess 30 to define the proxy test to be performed in step 1.

In a step 31 (QUE), the test results database is queried for previously gathered test results data gathered using a Proxy Test with required test conditions having values within a similar range.

In a step 32 (REL), a relevance score is calculated based on how well the input parameters fit the required test conditions for the associated proxy test (e.g. a high score for all input parameters within the test conditions) and the predictive power of the historic Test Results Data (e.g. a high score for larger datasets).

In a step 33 (RAN), the tests are ranked according to their relevance scores, and in a step 34 (EXE), the highest-ranking test is executed, if the associated score is higher than or equals to a predetermined threshold.

Optionally, if the score of the highest-ranked proxy test is not high enough, the system 10 may be configured to wait for a set of more favourable status and/or conditions to occur if the status and conditions are not suitable for the performance of a proxy test (e.g. unsuitable temperature, unstable discharge rate due to driving of the vehicle, limited historic proxy test dataset available for the given status and conditions), or if more suitable status and/or conditions are expected to occur later (e.g. based on predicted input parameters).

An example of the calculation of the relevance score is now described.

The database contains test results data of various proxy tests in a community of electric vehicle users, comprising the following data for each individual test results entry:

test conditions: outside temperature range at the start of the test, noted T,
test conditions: battery State-Of-Charge range at the start of the test, noted SOC,
test results: various parameters measured during the test, as well as the estimated SOH.

A Proxy Test needs to be performed for Vehicle A under the following conditions at the start of the test:

$T_{start}=21°$ C., and
$SOC_{start}=70\%$

The following proxy tests are available from the database:
Proxy Test 1: T=15° C.-18° C.; SOC=50%-80%; Number of test results data instances: 5000.
Proxy Test 2: T=20° C.-25° C.; SOC=50%-80%; Number of test results data instances: 200.
Proxy Test 3: T=20° C.-23° C.; SOC=50%-80%; Number of test results data instances: 3000.

A relevance score may be calculated based on the following scoring function:

$$\text{Relevance}=T_{match}\times SOC_{match}\times \text{Impact, where:}$$

$T_{match}=1$ if $T_{start}$ is inside range T, otherwise 0;
$SOC_{match}=1$ if $SOC_{start}$ is inside range SOC, otherwise 0;
Impact=number of test result instances for a given proxy test divided by 1000.

This gives the following relevance scores for the three proxy tests:
Proxy Test 1: Relevance=0×1×5=0,
Proxy Test 2: Relevance=1×1×0.2=0.2,
Proxy Test 3: Relevance=1×1×3=3.

There are various ways to improve this most simple scheme of relevance scoring, for example comprising more test conditions, comprising test conditions which are more restrictive, e.g. using a more fine-grained range T, using for the matching scores to the various conditions (e.g. $T_{match}$ and $SOC_{match}$) gradual scores (e.g. a number between 0 and 1) instead of absolute scores (e.g. 0 or 1), comprising weight factors to give more importance to certain test conditions over others, comprising the expected uncertainty for a calculated SOH as a factor in the scoring function.

Another Alternative Subprocess

Figure 5:
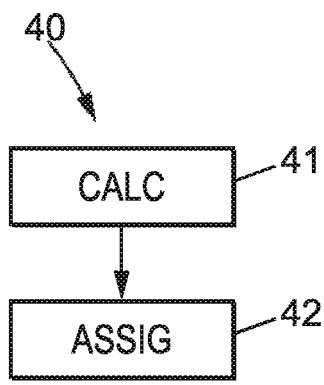

As can be seen from FIG. 5, the method 1 advantageously comprises another subprocess 40 to query the test results database for historic test results data collected under the same or similar status and/or conditions of the vehicle and then output a score or value (the "Test Results Data Value") related to how much the addition of new test results data to the test results database would be worth.

In other words, the subprocess 40 aims at updating the test results table with the current test results and then to evaluate the improvement in the probability of a hypothetical new test having the same results as the original test.

Based on the historic test results data available in the test result database, the method 1 comprises a step 41 (CALC) of calculating how the probability of the SOH Estimate would change if an full SOH test dataset would be gathered and added to the test results database together with the measured proxy test dataset.

The method 1 comprises a step 42 (ASSIG) of assigning a test results data value to the new test results data according to a pre-defined valuation function which may include various input variables, for example:

absolute or relative decrease in the uncertainty of the SOH Estimate,
demand for the proxy test, i.e. how many other electric vehicles may benefit from an increased accuracy of a proxy test under the given status and conditions of the battery. An estimate of the demand may be based on historic test results data provided by other users, e.g. how many users have similar make/model electric vehicles, how many other users operate their electric vehicles under similar operating conditions.

An example of step 42 is now described on the basis of the already mentioned table, called training sample, with the same results T1, T2 and $\overline{T3}$ of the already described proxy test.

The method 1 consists in assuming that full SOH test is performed after the above proxy test results have been obtained to determine the actual SOH value (Green, Orange or Red), which then can be added as a new entry to the table, yielding a training sample of 101. Thus, the above table will change in one of the 3 following tables:

If the full test results in green:

| Battery state (SOH) | M1 T1 | M1 $\overline{T1}$ | M2 T2 | M2 $\overline{T2}$ | M3 T3 | M3 $\overline{T3}$ | Total |
|---|---|---|---|---|---|---|---|
| Green | 41 | 10 | 36 | 15 | 40 | 11 | 51 |
| Orange | 20 | 10 | 15 | 15 | 25 | 5 | 30 |
| Red | 15 | 5 | 15 | 5 | 10 | 10 | 20 |
| Total | 76 | 25 | 66 | 35 | 75 | 26 | 101 |

If the full test results in orange:

| Battery state (SOH) | M1 T1 | M1 $\overline{T1}$ | M2 T2 | M2 $\overline{T2}$ | M3 T3 | M3 $\overline{T3}$ | Total |
|---|---|---|---|---|---|---|---|
| Green | 40 | 10 | 35 | 15 | 40 | 10 | 50 |
| Orange | 21 | 10 | 16 | 15 | 25 | 6 | 31 |
| Red | 15 | 5 | 15 | 5 | 10 | 10 | 20 |
| Total | 76 | 25 | 66 | 35 | 75 | 26 | 101 |

If the full test results in red:

| Battery state (SOH) | M1 T1 | M1 $\overline{T1}$ | M2 T2 | M2 $\overline{T2}$ | M3 T3 | M3 $\overline{T3}$ | Total |
|---|---|---|---|---|---|---|---|
| Green | 40 | 10 | 35 | 15 | 40 | 10 | 50 |
| Orange | 20 | 10 | 15 | 15 | 25 | 5 | 30 |
| Red | 16 | 5 | 16 | 5 | 10 | 11 | 21 |
| Total | 76 | 25 | 66 | 35 | 75 | 26 | 101 |

Depending on the results of the full SOH test (which are unknown before actually performing the test), the training sample thus is improved for other users wanting to perform a proxy test.

The calculated probabilities for a hypothetical user performing a proxy test with the same test results T1, T2 and $\overline{T3}$ are now changed, using the data from the above 3 tables, as follows.

If the full SOH test resulted in green, P(T1/green)=0.244, P(T2/green)=0.015, and P($\overline{T3}$/green)=0.015.

If the full SOH test resulted in orange, P(T1/green)= 0.244, P(T2/green)=0.020, and P($\overline{T3}$/green)=0.014.

If the full SOH test resulted in red, P(T1/green)=0.220, P(T2/green)=0.014, and P(T3/green)=0.019.

Therefore, one can now choose a way to quantify the value of the added data to the table.

For example, it could be assumed the full SOH test yields the most probable result (in this case "Green") and takes the associated probability increase (in this case P(T1/green)), in this case 0.244−0.233=0.011, as a measure of the new dataset value.

Also, a simple example of a pre-defined valuation function may be:

Test Results Data Value=*IP*×Impact, where

IP means Increase Percentage of the calculated Probability, Impact means number of unique users with the same battery model regularly accessing the test results database.

So, if the newly gathered test results data would yield IP=0.011 and the Impact=8000, this would result in the Test Results Data Value=880.

Another Alternative Subprocess

Advantageously, the method 1 comprises a subprocess 50, called full SOH testing cost evaluation algorithm, able to calculate a negative effect of performing a full test under a given status and conditions, according to a defined parameter, e.g. energy cost due to discharge, duration of the test, negative effect on the lifetime of the battery.

The subprocess 50 then gives as output a score or value proportional to the defined parameter (the "full SOH Testing Cost") which can be compared to the test results data value.

The calculation of the full test is performed using various inputs, for instance:
  cost of the energy required for (re)charging of the battery during or after the full SOH Test,
  estimated cost of the degradation of the battery as a consequence of the SOH Test, based on data provided by the manufacturer, optionally based on historic test results data,
  Optionally, a factor, called inconvenience Factor, which is a factor related to the potentially subjective value of other activities the battery could be used for instead of performing the full SOH test, that may in turn depend on various factors such as the duration of the full SOH test and the user's travelling schedule. A high inconvenience factor would mean that the user is not very willing to commit to performing the full SOH test, thus increasing the full SOH testing cost, therefore requiring a much higher test results data value to incentivize the user to perform the full SOH Test.

If the test results data value is higher than the full SOH testing cost, the test module schedules and executes both a full SOH test and a proxy test, as already described.

Optionally, the system may wait for a later moment to execute the full SOH test, if a lower cost and/or higher value is expected in a near future. This prediction may be performed based on expected improvements of the various input variables used to calculate the test results data value and the full SOH Testing Cost, like better future energy prices, environmental conditions which are expected to be less detrimental for the battery or a lower inconvenience to the user.

A simple example of how the full SOH Testing Cost can be calculated is as follows:

Full SOH Testing Cost=Energy Cost+Battery Depreciation Cost, where

Energy Cost=Total Discharge Energy×Energy Unit Price, and

Battery Deprecation Cost may be given by a simple lookup table, in which the Battery Depreciation Cost is given for various environmental conditions (e.g. temperature range) when performing an SOH Test such as a full charge/discharge cycle.

So, for a battery with 75 kWH capacity, an Energy Unit Price of €0.15/kWH and a battery depreciation cost of €20 due to charge/discharge under the given environmental temperature (e.g. 0.2% of a total Battery cost of €10 k), the full SOH Testing Cost is given by € (75×0.15+20)=€31.25.

As already noted, if the test results data value is higher than the full SOH testing cost, the test module schedules and executes both a full SOH test and a proxy test.

A simple example of how to compare the test results data value with the full SOH Testing Cost is as follows:
  multiply the test results data value with a Pricing Conversion Factor, corresponding with the amount each user is willing to spend on the Increase Percentage of the full SOH test. For example, if each user would be willing to spend €0.04 for each 0.01% Increase Percentage, this translates in multiplying the Test Results Data Value as defined in previous example with the pricing conversion factor of €0.04,
  given the example of above with test results data value equals 880, the monetary equivalent of this test results data value is given by € (0.04×880)=€35.20, which is higher than the full SOH Testing Cost=€31.25. In this case, it would pay off to perform the full SOH Test.
  Any other method to assign a monetary value to a given test results data value or to compare the test results data value with the full SOH testing cost is valid.

Additional Embodiment

In an additional embodiment, the system 10 may perform additional actions to promote the gathering of a full SOH test dataset. This may be achieved by performing one or several of the following steps:
  provide a recommendation or reminder to the user, for example about suitable moments to gather test results data, about the size of the reward. This may be done e.g. by sending the user a text message, showing a text on the dashboard display, etc.,
  automatically schedule a full SOH Test for the user when certain conditions are met, e.g. when the SOH Testing Cost is below a certain value.

The disclosure is indeed not limited to the above-mentioned steps. Moreover, all the above-mentioned subprocesses and additional embodiment can be combined.

Advantages

The method 1 helps users to gather test data to determine the battery life of their vehicle battery in a convenient way.

The method 1 and associated system 10 may be used to help users better manage testing and gathering test data, as well as allowing users or groups of users to create their own tests.

Specifically, the following advantages are enabled.

The method can determine the SOH estimate with reasonable accuracy (depending on the available test results data in the test results database) without the user having to perform a full SOH Test. This is of interest to users wanting to determine the resale value of their battery, or wanting to regularly keep track of their battery's degradation or the influence of environmental conditions and/or usage patterns on the SOH.

Users may use proxy tests to determine the SOH Estimate more often than they would perform full SOH tests and/or they may perform the proxy test at times when a full test is less convenient (due to time constraints).

The method can gather datasets to define new proxy tests and gather data to increase the predictive value for these new proxy tests. These new proxy tests may be integrated into a usage pattern, such as a user journey schedule or environmental conditions the vehicle is regularly exposed to. The new proxy tests may be tied to a specific user group having similar electric vehicle, batteries, operating conditions, or other potentially relevant variables.

The method can recommend or incentivize users when to perform full test, e.g. if the gathered dataset is calculated to be advantageous for a group of users. The recommendations/incentives may have the advantages of increasing the number of users actively contributing to collecting datasets to help improve the predictive power of a proxy test, and discouraging users to perform a full test when proxy tests can be used to obtain accurate enough information about the SOH, thus reducing the negative effects the full test can have on the Battery's lifetime.

In general, when implemented in a large number of electric vehicles, the method may cause users to gather more test data, more useful and more diverse datasets, with more detailed/fine-grained information about battery usage and health, which is of interest to car and battery manufacturers as well as the users themselves.

The invention claimed is:

1. A method for evaluating a state of health (SOH) of an electric battery of an electric vehicle, said method comprising:
    performing on said electric battery, under given conditions, a proxy test, said proxy test including a partial charge and/or discharge action of the battery;
    comparing the results of the proxy test with data stored in a dataset; and
    estimating the SOH in function of the comparison result, wherein the step of performing the proxy test comprises:
    comparing proxy tests that are available in a dataset;
    associating a score to each of the proxy tests;
    ranking said proxy tests; and
    executing a highest-ranking test of the proxy tests if the associated score is higher than or equals to a predetermined threshold.

2. The method of claim 1, wherein the score depends on the given conditions of the battery.

3. The method of claim 1, wherein, if the associated score is smaller than the predetermined threshold, no proxy test is performed.

4. The method of claim 1, wherein the step of estimating the SOH comprises a Bayesian ponderation.

5. The method of claim 1, further comprising:
    performing a full SOH test, including a full charge and/or discharge action of the battery; and
    storing a result of the full SOH test in the dataset.

6. The method of claim 5, wherein performing a full SOH test is done if an SOH testing cost is smaller than a value associated to the proxy test calculation.

7. The method of claim 5, wherein performing a full SOH and storing the result in the dataset is preliminary to any proxy test.

8. The method of claim 1, further comprising storing the results of the proxy tests in the dataset.

9. A non-transitory computer-readable medium having stored thereon computer-executable instructions for carrying out the method of claim 1 when executed by a processor.

10. A system configured to carry out the method of claim 1.

* * * * *